United States Patent [19]

Hartman et al.

[11] 4,093,872
[45] June 6, 1978

[54] CHARGE COUPLED DEVICE WITH INPUT FOR DIRECT INJECTION OF SIGNAL

[75] Inventors: John M. Hartman, Costa Mesa; Darrell M. Erb, Newport Beach, both of Calif.

[73] Assignee: Hughes Aircraft Company, Culver City, Calif.

[21] Appl. No.: 609,774

[22] Filed: Sep. 2, 1975

Related U.S. Application Data

[63] Continuation of Ser. No. 436,587, Jan. 25, 1974, abandoned.

[51] Int. Cl.² .............. G11C 19/28; H01L 29/78; H01L 27/14; H01L 31/00
[52] U.S. Cl. .................. 307/221 D; 357/24; 357/30
[58] Field of Search ............. 357/24, 30; 307/221 D, 307/304

[56] References Cited

U.S. PATENT DOCUMENTS

| | | | |
|---|---|---|---|
| 3,760,202 | 9/1973 | Kosonocky | 357/24 |
| 3,771,149 | 11/1973 | Collins et al. | 357/24 |
| 3,789,267 | 1/1974 | Krambeck et al. | 357/24 |
| 3,796,932 | 3/1974 | Amelio et al. | 357/24 |
| 3,801,883 | 2/1974 | Tiemann | 357/24 |

OTHER PUBLICATIONS

Tompsett, "Charge Transfer Devices," J. Vac. Sci. Technology, vol. 9, No. 4, (7–8/72), pp. 1166–1181.
Tompsett, et al., "Use of Charge-Coupled Devices for Delaying Analog Signals," IEEE, J. Solid State Circuits, vol. SC-8, (4/73), pp. 151–157.
Melen, et al., "One-Phase CCD: A New Approach to Charge-Coupled Device Clocking," IEEE, J. Solid State Circuits, (2/72), pp. 92–93.
Tompsett, "Using Charge-Coupled Devices for Analog Delay," CCD Applications Conf., Proc. (9/73), San Diego, Calif.
Erb, et al., "Buried Channel Charge Coupled Devices for Infrared Applications," CCD Applications Conf., Proc. (9/73), San Diego, Calif.
Steckl, et al., "Theoretical Analysis of Directly Coupled 8–12μm Hybrid IRCCD Serial Scanning," CCD Applications Conf., Proc. (9/73), San Diego, Calif.

*Primary Examiner*—William D. Larkins
*Assistant Examiner*—Gene M. Munson
*Attorney, Agent, or Firm*—W. J. MacAllister; Joseph E. Szabo

[57] ABSTRACT

Signals generated by an infrared (I.R.) detector are injected directly into a charge coupled device (CCD) by means of a DC biased electrode structure interposed between the detector and one of the clocked transfer electrodes of the CCD.

8 Claims, 12 Drawing Figures

CHARGE COUPLED DEVICE WITH INPUT FOR DIRECT INJECTION OF SIGNAL

This is a continuation of application Ser. No. 436,587, filed Jan. 25, 1974, now abandoned.

BACKGROUND OF THE INVENTION

The present invention relates generally to charge coupled devices and, more particularly, to the adaptation of such devices for receiving and processing signals generated by photovoltaic infrared detectors.

When an infrared image is to be detected, it is customary to do so by arranging a plurality of infrared detectors of the photovoltaic type into an ordered array, which includes one or more columns of such detectors. The infrared image is scanned over the detector columns so that successive detectors in a given column detect a given portion of the image in sequence. In such an arrangement, the signals produced by detectors in a given column are applied to a signal shifting device so that the signals produced by all of the detectors in that column arrive at the output of the device at the ame time. In this way, random variations in the responses of various detectors are minimized by averaging their cumulated outputs.

A delay line with discrete components for carrying out this shifting and integrating function is disclosed in Laakmann U.S. Pat. No. 3,723,642 assigned to the present assignee. The desirability of replacing such a delay line with a CCD shift register is suggested in application Ser. No. 436,586, now U.S. Pat. No. 3,883,437 entitled MONOLITHIC IR DETECTOR ARRAYS WITH DIRECT INJECTION CHARGE-COUPLED DEVICE READ OUT, filed on even date herewith by D. J. Holscher, J. Nummedal, J. M. Hartman, and D. M. Erb and assigned to the present assignee. Also proposed in the referenced patent application is the desirability of injecting the signals produced by the IR detectors directly into the CCD without the use of an intermediate amplifier.

A recent development, charge coupled devices are by now well known, as exemplified for example by Kahng et al. U.S. Pat. No. 3,651,349 issued Mar. 21, 1972. In such a device when organized as a shift register, a dielectric layer is disposed over a surface of a semiconductive storage medium and a series of electrodes are disposed in or over this dielectric layer in a row so as to cause a series of depletion regions or "potential wells" to be formed in response to clock voltages which are applied to the electrodes periodically. The potential wells serve to store packets of electric charge which are injected into the storage medium through a P-N junction and the clocked electrodes in response to the voltages applied thereto transfer these charge packets along the potential wells.

When signals from a plurality of photovoltaic infrared detectors are to be handled by a CCD shift register so as to cause their sequentially produced outputs to arrive at the output of the shift register at the same time, the outputs of successively actuated detectors are applied to successive stages of the CCD shift register, each stage being usually represented by a respective pair of potential wells and the clocked electrodes which create them.

The direct application of the output of a photovoltaic infrared detector to a given stage of a CCD shift register tends to have some shortcomings in the absence of special provisions being made, such as the one which is the subject of the present invention.

The first problem created by direct coupling is that voltage spikes are coupled back into the injecting junction from the nearest clocked charge transfer electrode as a result of clocking pulses which are applied to that electrode. The reason for this coupling back into the injecting junction is that the nearest transfer electrode normally overlaps the injecting junction in order to have control over the charge which is to be transferred from the injecting junction to the potential well associated with that electrode. The overlap creates a coupling capacitance and it is through that capacitance that the voltage spikes are coupled back into the injecting junction. If a detector is connected directly to this injecting junction, the coupled back voltage spikes appear across the detector and affect its operation adversely.

Overlapping of the injecting junction by the first transfer electrode creates an additional problem for direct injection into a CCD. To wit, the detector can be utilized only during the ON period of the clocking pulse which is applied to the first transfer electrode. During this ON period, charges which are injected through the injecting junction are promptly swept away from that junction, thus enabling it to accept additional charges from the detector. During the OFF period of the clock, however, the detector cannot be used, because during that period, the incoming charges accumulate at the injecting junction and raise its bias voltage to an unacceptable level. This applies particularly to detectors which are bias sensitive, such as photovoltaic I. R. detectors. Such detectors have a limited tolerance for variations in the bias voltage to which they are subjected. Thus, such detectors could not operate properly if their bias voltage were permitted to rise to the levels which tend to result when charge buildup during the OFF clock periods is permitted. If the detector is then limited to operating only during the ON period of the clock pulse, its sensitivity will be reduced, since it is only operating during that fraction of the time which corresponds to the ON period of the clock pulse.

A signal might be injected from a detector into a CCD through a coupling capacitor. Such an approach has at least one shortcoming: the size of the capacitor necessary to accommodate low frequency bandpass characteristics associated with many detectors which would be used with CCDs would be excessive. The necessary capacitor size would be excessive for an additional reason: during the operation of the CCD, charge accumulates on the capacitor and, unless the capacitor had a very large value, the resulting voltage would raise the bias voltage of the detector to an unacceptably high level.

It is, therefore, a principal object of the present invention to effect direct injection of the signal from an I. R. detector into a CCD without adversely affecting the performance of the detector.

A related object of the invention is to provide direct coupling between an I. R. detector and a CCD without incurring bias voltage fluctuations, either through the accumulation of charge or through clock created transients.

It is a further object of the invention to provide an improved CCD which is adapted to receive signals directly from an I. R. detector while permitting the detector to generate a useful signal 100% of the time.

These and other objects of the invention are attained by providing a CCD of the type described hereinabove with means for individually injecting charge from one or a plurality of I. R. detectors into the storage medium near one or a corresponding plurality of its potential wells. An electrode structure is disposed between each of the injecting means and its associated potential well and a steady bias voltage is applied to the electrode structure so as to create thereunder a potential well. The electrode structure preferably includes a transfer portion nearest the injecting means and a storage portion nearest its associate potential well, with the potential well which is being maintained under the electrode structure, being deeper under the storage portion than it is under the transfer portion.

The transfer portion of the electrode structure functions as a transfer electrode between the injecting junction and the nearest clocked transfer electrode of the CCD. The coupling back of voltage spikes is prevented by the present invention since, there is no longer a need for an overlap between the injecting junction and the clocked transfer electrode nearest to it. Charge accumulation and bias voltage buildup are also prevented because the storage portion of the electrode structure of the present invention creates a potential well which acts as a reservoir into which charges can flow from the injecting junction even when the clock voltage on the nearest transfer electrode is OFF. This charge reservoir keeps the injection free of such charges and capable of accepting additional charges without raising its operating bias level.

Referring now, more specifically, to the Figures, an exemplary CCD semiconductor apparatus 11 incorporating features of the present invention is illustrated in FIGS. 1-6. It includes a dielectric layer 15 such as silicon dioxide disposed over a semiconducting storage medium or substrate 13 such as silicon, having a given conductivity type, shown as N. Disposed over and in the dielectric layer 15 are a series of clocked electrodes 17. As is well known to those skilled in the art, such electrodes in CCD devices may take many forms. In the particular configuration illustrated in FIGS. 1-6, each electrode 17 is comprised of two separate sections which are electrically interconnected. They comprise a metal transfer electrode portion 17a lying on the surface of the dielectric layer 15 and a storage electrode portion 17b which is buried in the dielectric. This configuration has the advantage of permitting close spacing of the electrodes while minimizing the tolerances required. Preferred materials for the transfer and storage electrode portions 17a and 17b hereinafter "transfer electrodes" and "storage electrodes" are aluminum and polycrystalline silicon, respectively. The storage electrodes 17b serve to create, through the imposition of clock voltages in a manner to be explained hereinafter, potential wells under them in which "packets" of minority carriers (holes in the case of N type material) may be temporarily stored. The function of the transfer electrodes 17a is primarily to encourage the unidirectional flow of minority carriers between the potential wells.

Formed near one of the electrodes 17 is an injecting junction 19 which is usually created by a diffusion 21 in the semiconducting substrate and being of the opposite conductivity type from the substrate, or P+ in the illustrated embodiment. Charges are injected through the PN junction 19 by a metal contact 23 on top of the diffusion 21 from a signal source shown to be a photovoltaic infrared detector 25 whose equivalent circuit includes a voltage source 27 shunted by a resistance 29. As explained hereinafter, such a detector is exemplified by a photovoltaic indium antimonide (In Sb Pv) photodiode whose characteristic curves appear in FIG. 7.

Figure 1:
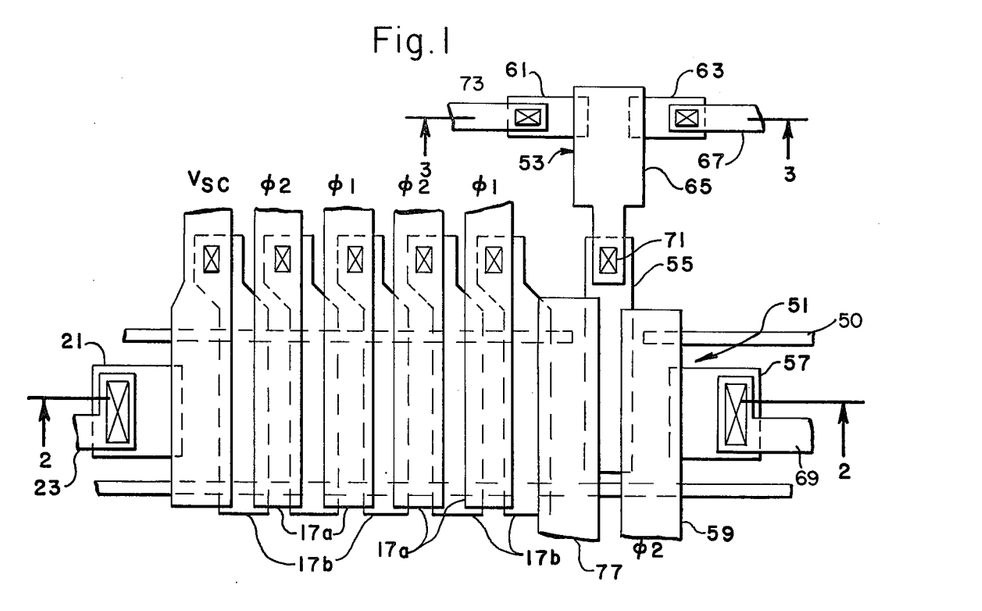
FIG. 1 is a plan view of a CCD wherein charge is directly injected from a single infrared detector.
Figure 2:
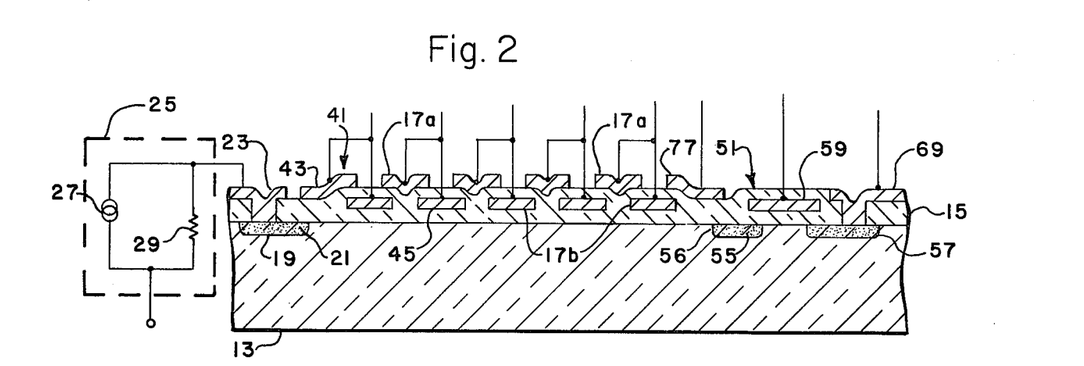
FIG. 2 is a cross section through FIG. 1 illustrating the electrode structures whereby charge is injected into, stored in, transferred through, and fed out of the CCD of FIG. 1.
Figure 3:
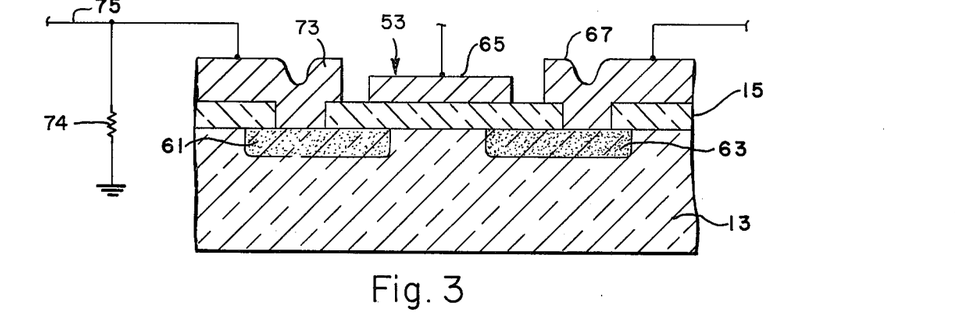
FIG. 3 is a cross section through FIG. 1 to illustrate portions of the output structure of the CCD.
Figure 4:
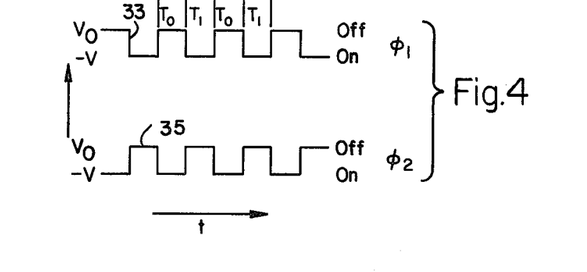
FIG. 4 is a pair of voltage diagrams to illustrate the clock pulses by which charge is transferred along the CCD.
Figure 5:
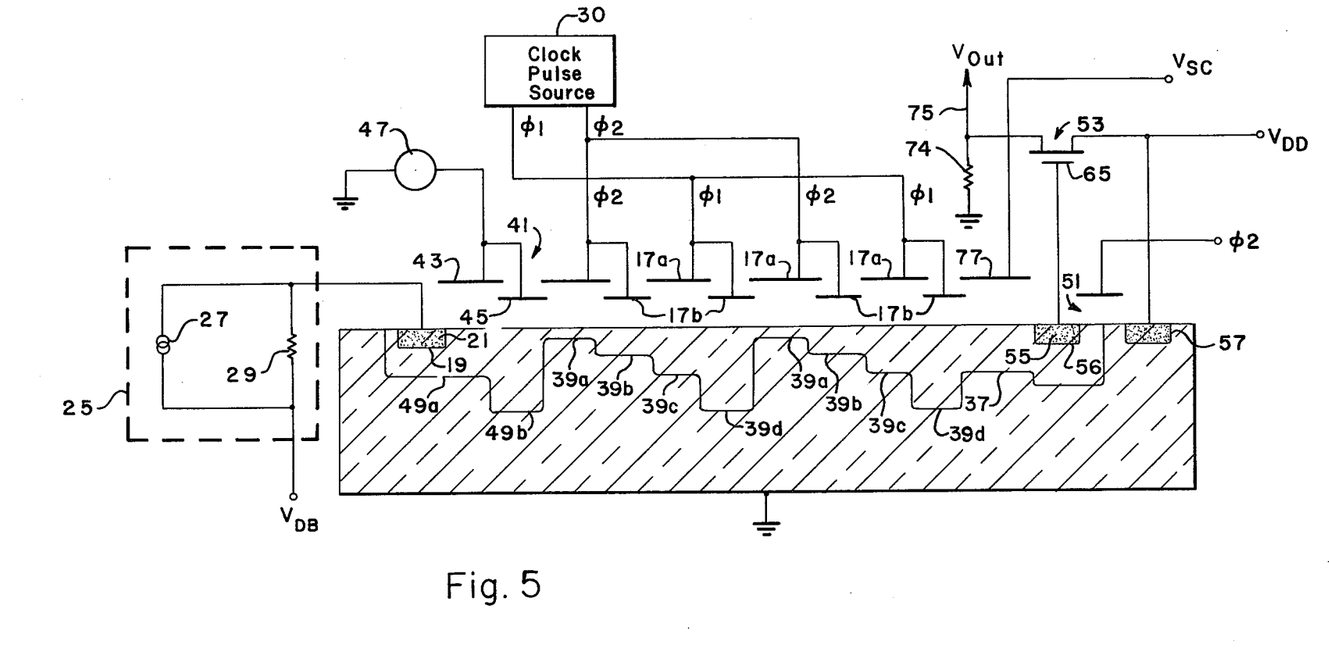
FIG. 5 is the first of two sequential diagrams illustrating the charge distribution in the CCD during the first half of its clocking cycle.
Figure 6:
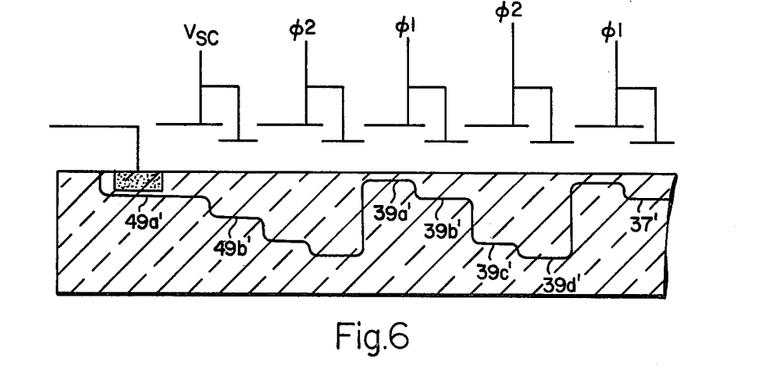
FIG. 6 is the second of the two sequential diagrams illustrating the charge distribution in the CCD during the second half of its clocking cycle.

Operating voltages for the electrodes 17 are derived from a two-phase clock pulse source 30, with alternate electrodes being connected to opposite ones of the phase 1 and phase 2 outputs of the clock. FIG. 4 illustrates the waveform of the phase 1 and phase 2 clock voltages 33 and 35. FIGS. 5 and 6 show the disposition of the potential wells created when the clock pulse waveforms are applied to the electrodes. During the period when the phase 1 clock is ON, meaning that it is at a potential of $-V$, while the phase 2 clock is OFF, shown as being at a much more positive voltage level $V_o$ (but not more positive than flat band voltage), the depletion region boundary 37 is shown in FIG. 5. It is seen that the depletion region is deepest at 39d under that storage electrode 17b to which the ON phase 1 clock voltage is being applied. Conversely, the depletion region is shallowest in the area designated 39a, which is under that transfer electrode 17a to which the OFF phase 2 clock voltage is being applied. The intermediate regions 39b and 39c between the extreme regions 39a and 39b taper stepwise between the two. It can be shown that, with this configuration of the depletion region, minority carriers in the region above 39a–39d will tend to progress toward and collect in the deepest portion 39d of the depletion region.

During the next portion of the clock cycle, when the potentials of the phase 1 and phase 2 clock voltages are reversed, the depletion region is defined by the boundary 37' shown in FIG. 6. The essential difference from the situation depicted in FIG. 5 is that the potential wells 39d have each moved from the storage electrode portion 17b under which they had been located previously to the next such electrode portion to the right. It can also be shown that, as a result of this shift, each depletion region carries with it the charge which it had contained during the previous portion of the clock cycle. Alternatively, this relationship can be expressed by saying that the potential wells 39d which had existed during the portion of the clock cycle represented by FIG. 5 are eliminated during the next portion of the clock cycle and are replaced by the depletion regions 39d' shown in FIG. 6. In both cases, the result is the same. The charge which had been stored in a potential well under a given storage electrode 17b during the time period To is shifted to the right as seen in FIGS. 5 and 6 and is located in a potential well under the next such storage electrode. In this manner a charge packet is shifted from one electrode 17 to the next such electrode to its immediate right once during each clock cycle.

In keeping with the present invention, means are provided to transfer the charge injected through the P+ diffusion 21 to the first of the clocked electrodes 17. Such means include an input electrode structure 41, having a transfer portion 43 and a storage portion 45 whose functions are analogous to the functions of the transfer and storage electrodes 17a and 17b. To insure continuity of the channel through which minority carriers flow from the diffusion 21 to the first electrode 17, the transfer portion 43 of the input electrode structure (hereinafter "input transfer electrode") overlaps both the diffusion 21 and the storage electrode portion 45 (hereinafter "input storage electrode") of that structure. For the same reason, an overlap is provided between the input storage electrode 45 and the first clocked transfer electrode 17a. Charge flow is confined within a channel by an N+ doped channel stopping region 50.

In further keeping with the invention, the input electrode structure 41 is energized from a source of constant potential 47, thereby maintaining a uniform, unchanging depletion region 49 which connects the diffusion 21 with the initial portion 39a of the depletion region defined by the boundary line 37. Thus, a comparison of FIGS. 5 and 6 shows that while the depletion regions under the electrodes 17 alternate or shift, the depletion regions shown by the level 49a under the diffusion 21 and the input transfer electrode 43 and by the deeper region 49b under the input storage electrode 45 remain unchanged. As a result, as explained previously, voltage fluctuations are absent from the input electrode structure 41 which therefore acts as a screen interposed between the first clocked electrode 17 and the diffusion 21, preventing the feed-back of voltage fluctuations from that first electrode through the diffusion 21 to the infrared detector 25.

The configuration of the depletion region under the input electrode structure 41 insures that an input potential well 49b is maintained between the input junction 19 and the first clocked electrode 17 so that minority carriers can continue to flow out of the junction 19 into potential well 49b even when the clock voltage on the first electrode 17 might otherwise prevent such continued charge outflow.

For proper operation of the detector 25, its bias is maintained at a potential $V_{DB}$ which is equal to the surface potential under the input transfer electrode 43. Thus, with one terminal of the infrared detector diode 25 being connected to the P+ diffusion 21 and its other terminal being connected to a source of potential $V_{DB}$ equal to the surface potential under the diffusion, it is seen that the normal bias potential across the infrared detector is zero.

Figure 7:
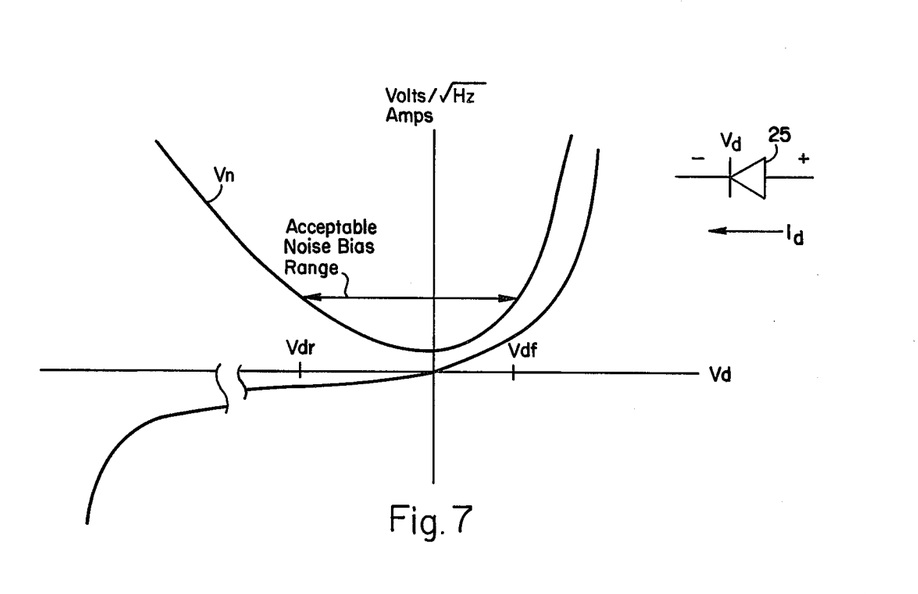
FIG. 7 is a characteristic curve for a photovoltaic I. R. detector illustrating the limits within which it must operate.

The advantage of the present invention in maintaining a proper bias voltage across the infrared detector may be better appreciated by referring to FIG. 7, which shows the detector noise $V_N$ and the diode current $I_D$ plotted against the bias voltage across the detector. The plot of detector noise $V_N$ shows that it increases rapidly with an increase in bias voltage and that there exists a definite limit beyond which such voltage should not be permitted to go. It has been found with presently available photovoltaic detectors that the acceptable range of excursion of detector bias voltage is on the order of 50 millivolts. This can be readily attained by the use of the present invention.

Having discussed the manner in which charge is fed into the CCD 11 illustrated in FIGS. 1 through 6, and is stepped along its surface by means of the clocked electrodes 17, there will next be described with reference to those figures, simply for sake of completeness, a suitable circuit configuration for reading those charges out. They include a pair of MOSFETs 51 and 53 formed in the same N-type semiconducting substrate 13 on which the CCD device is fabricated. The first MOSFET 51 includes P+ conductivity type source and drain regions 55 and 57 bridged by a polycrystalline silicon gate 59 buried in the oxide 15 and separated thereby from the substrate 13. Similarly, the second MOSFET 53 is comprised of spaced apart P+ source and drain regions 61 and 63 overlapped by a polycrystalline silicon gate 65 lying on a thin portion of the oxide layer 15. Through contacts 67 and 69, the drains of the MOSFETs 51 and 53 are connected to a drain voltage supply $V_{DD}$. The gate 65 of MOSFET 53 extends over and is connected to the source of the first MOSFET 53 at the point 71, thereby making the second MOSFET 53 responsive to the first MOSFET 51. Completing the connections to the second MOSFET 53 is a contact 73 which connects its source 61 to ground through a load resistor 74 across which the signal output of the CCD appears at a point 75 labeled $V_{OUT}$. Coupling charges from the last of the clocked electrodes 17b into the source of the first MOSFET 51 is an output screen, or transfer, electrode 77 configured essentially like the input transfer electrode 43 and overlapping both the source 55 of MOSFET 51 and the last electrode 17b.

Operation of the output circuit as thus described may be appreciated by considering the progress of charge packets through the output circuit during successive periods of the clock voltages 33 and 35. During the ON period of phase 2, a CCD charge packet collects under the next to the last storage electrode 17b. The first MOSFET 51 is conductive then, because its gate 59 is at a turned-on or negative potential, since it too is energized by the phase 2 voltage 35.

As a result, electrons flow from the $V_{DD}$ voltage supply through the MOSFET 51 to its source 55, causing the source junction 56 to charge to a negative voltage $Vc = Vdd - Vto$, where Vto is the MOSFET threshold voltage taking into account the back gate bias effect.

The output screen voltage Vsc being applied to the output transfer or screen, electrode 77 is selected so that the resulting surface potential under the electrode 77 is between the potential at the source junction 56 and the surface potential under the nearest storage electrode 17b. This insures that minority carriers (holes) will flow from the potential well 39d under the last storage electrode 17b to the junction when Φ1 returns to its most positive potential. At the same time, the output transfer electrode 77 obviates the need for capacitive coupling between the last clocked storage electrode 17b and the junction 56, thereby preventing the feedthrough of undesired voltage fluctuations to that junction. In this way the output transfer electrode 77 performs the same function and operates in the same manner as the input transfer electrode 43.

At the end of time period $T_O$, as shown in FIG. 4, a voltage gradient exists between the last storage electrode 17b and the collecting junction 56, suitable for the flow of holes toward that junction, and there is available at that junction a quantity of electrons ready to combine with a corresponding quantity of holes. This combination occurs during the next period of the clock cycle, shown in FIG. 4 as $T_1$, when the phase 1 clock pulse goes to its ON potential, creating a potential well 39d under the last storage electrode 17b. As a result, the charge packet which had been stored in a potential well 39d under the next-to-the-last storage electrode 17b during the preceding time period To is transferred to the last such storage electrode, that which is adjacent to the transfer electrode 77. At the same time $T_1$ that the charge packet arrives in the last potential well 39d, the phase 2 clock voltage 35 goes to its OFF potential, stopping the flow of electrons through the MOSFET 51. During this time period the charge packet dumped into the last potential well 39d continues to flow out of it through the region under the output transfer electrode 77 to the area of the collecting junction 56 where it is cancelled by the electrons positioned there. This cancellation of holes causes the junction voltage Vc to rise by an amount $$\Delta V = Q/C$$

where
$Q$ = signal charge
$C$ = nodal capacitance of PN junction 56

The voltage rise $\Delta V$ is applied to the gate 65 of MOSFET 53, causing a corresponding change in its source-to-drain current. The source-to-drain current change develops a corresponding voltage change $V_0$ across the output resistor 74 and this voltage change represents the output of the CCD 11.

When during the next time period $T_0$ the phase 2 clock voltage 35 returns to its ON state, the outgoing collecting junction 56 is reset to its original state, i.e. charged with electrons, before the next signal packet arrives during that same time period. Thus, with the two-phase clock arrangement as shown in FIGS. 1–6 once during each clock period represented by $T_0$, $T_1$ in FIG. 4, a charge packet is stepped from a given storage electrode 17d to the next such electrode to its immediate right, and once during such a clock period a charge packet is shifted from the last storage electrode to the collecting junction 56.

Figure 8:
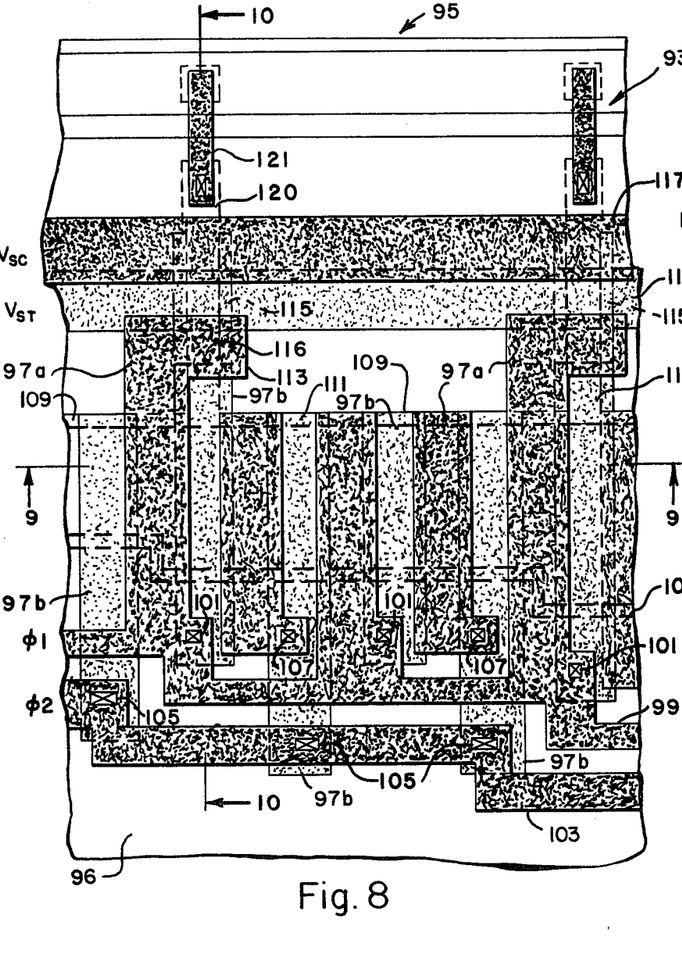
FIG. 8 is yet another embodiment of the present invention wherein direct injection is effected between a plurality of I. R. detectors and a corresponding plurality of stages in a CCD shift register.
Figure 9:
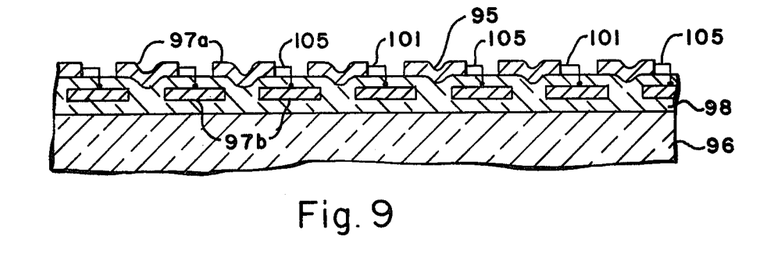
FIG. 9 is a cross section through FIG. 8 along lines 9—9.
Figure 10:
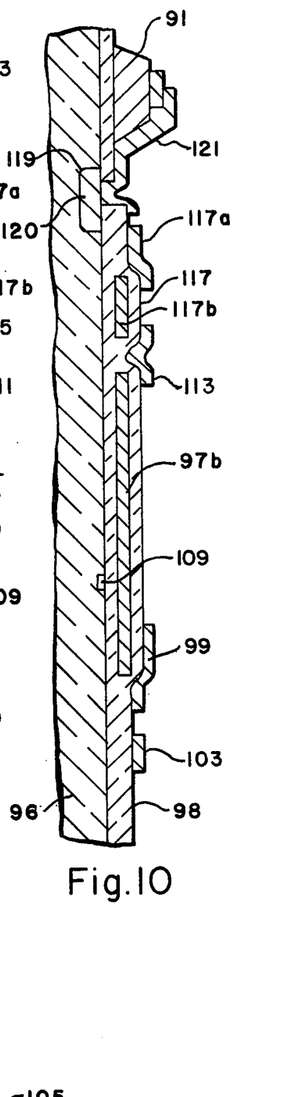
FIG. 10 is a second cross section through FIG. 8 along lines 10—10.

What has been described thus far, in detail, has been the direct injection of a signal in the form of an electric charge into a CCD from a single signal source. The greatest advantage which derives from the present invention, whereby a signal may be directly injected without adverse effects into a CCD, is to be found where signals are to be injected from a plurality of signal sources into successive stages of a CCD shift register. The reason is that direct injection from a plurality of signal sources into a CCD saves a corresponding plurality of coupling amplifiers which would otherwise be required. Such an application of the present invention is illustrated in FIGS. 8, 9, and 10. Shown there are two stages 93 of a CCD shift register 95, with an IR detector 91 being situated next to each CCD stage. Formed on an N conductivity type substrate 96 is a dielectric layer 98 upon and within which a series of electrodes 97 are distributed in a row. Each CCD stage 93 comprises four such electrodes. Each electrode 97 is made up of a metal transfer electrode 97a and a buried polycrystalline silicon electrode 97b.

In a manner to be explained next, both portions 97a and 97b of each electrode 97 are electrically connected to the same clock voltage. More particularly, a phase 1 clock voltage such as that shown in FIG. 4 is applied to the first and third transfer electrode 97a of each CCD stage 93 by means of a bus 99 which runs the length of the CCD 95 and which is integral with those transfer electrodes. Contact points 101 connect the first and third transfer electrodes 97a to their associated first and third storage electrodes 97b which are located below them and to their immediate right. This connection is indicated by lines 101 in FIG. 11.

A phase 2 clock voltage, as shown in FIG. 4 is applied to the second and fourth electrodes 97 of each CCD cell 93 by means of a second bus line 103 running generally parallel to the first bus line 99. The phase 2 bus line 103 is connected to the second and fourth storage electrodes 97b through contacts 105, shown by lines 105 in FIG. 11 as well as in plan view in FIG. 10. The second and fourth transfer electrodes receive the phase 2 clock voltage through contacts 107 which connect them with the second and fourth storage electrodes 97b. Thus, it is seen that alternate electrodes 97 are energized with opposite ones of the phase 1 and phase 2 clock voltages.

It will be understood that, as in the case of the embodiment illustrated in FIGS. 1–6, the two-phase CCD structure illustrated in FIGS. 8–10 is only one of many to which the present invention may be applied and is shown here simply to serve as a concrete illustration of the manner in which the invention may be employed.

Running along the CCD is a channel stopping region 109. With an N-type substrate the channel stop is an N+ doped strip and serves to confine the charge packets being passed by the electrodes 97 to the area defined by the channel stopper. An inlet into each CCD stage 93 is provided by an opening in the channel stopper 109, such opening being defined by extensions 115 which define a channel 116 between a given one of detectors 91 and the CCD stage 93 which is to receive its output. In this regard it will be noted that the first transfer electrode 97a of each CCD stage 93 serves not only to pass charge from the previous CCD stage 93 to its own stage but also to pass charge from the input channel 116 to the first storage electrode 97b of its stage. Similarly, the first storage electrode 97b of each stage 93 serves not only to store successive charge packets passed to it from the preceding CCD stage 93 but also to store initially the charge injected into its stage from its associated IR detector 91. To perform this second function, the first transfer electrode 97a and the first storage electrode 97b of each CCD stage 93 are configured differently from the other such electrodes. The first transfer electrode 97a is L-shaped, with its transverse foot portion 113 extending across the input channel 116.

The first storage electrode 97b is made longer so as to reach under the foot 113 of the transfer electrode 97a.

Charge is injected from each detector 91 into the input channel 116 next to it through an injecting junction 119 formed by means of a diffusion 120 as in the embodiment of FIGS. 1-6. An electrical connection is made from the junction 91 to the diffusion 120 through a connecting lead metallization 121. In accordance with the present invention, direct coupling is effected by an input electrode structure, again formed of an input transfer electrode 117a and an input storage electrode 117b. The input storage electrode 117b is again shown as a buried polycrystalline silicon electrode and the storage electrode 117a is shown to extend along the surface of the dielectric 98 and formed in the same metallization step used to create the other surface electrodes 97a. Again, the input transfer electrode 117a overlaps both the injecting junction 119 and the storage electrode 117b.

Both the input transfer electrode 117a and the input storage electrode 117b may be formed of an integral conductor running the length of the CCD device 95 and supplied with steady bias voltages $V_{sc}$ and $V_{st}$. It will be noted that in FIGS. 8-10 the input transfer and storage electrodes 117a and 117b are not shown to be connected together, thereby permitting their voltages to be individually adjusted. If individual adjustment is not desired, the input transfer and storage electrodes 117a and 117b may be connected to a common bias voltage source in the manner illustrated in FIG. 5.

In operation, charge packets are injected from respective ones of the detectors 91 into their associated CCD stages 93 in the same manner as explained with reference to FIGS. 1-6. Once such a charge packet reaches the potential well under the first storage electrode 97b in the CCD stage 93, this occurring once during each time period To, that charge packet enters the main stream of charge flow in the CCD and is stepped toward the right along successive stages, one stage during each two clock periods. By synchronizing the clock frequency to the rate at which an image is scanned across successive detectors 91, all charges produced by them may be made to arrive at the last CCD stage 93 at the same time. To accomodate the progressively larger charge packets which they need to store, successive CCD stages 93 are made progressively larger, as indicated by the progressive increase in the width of the channel areas defined by the channel stopper 109 in the three stages shown in FIG. 8.

Figure 11:
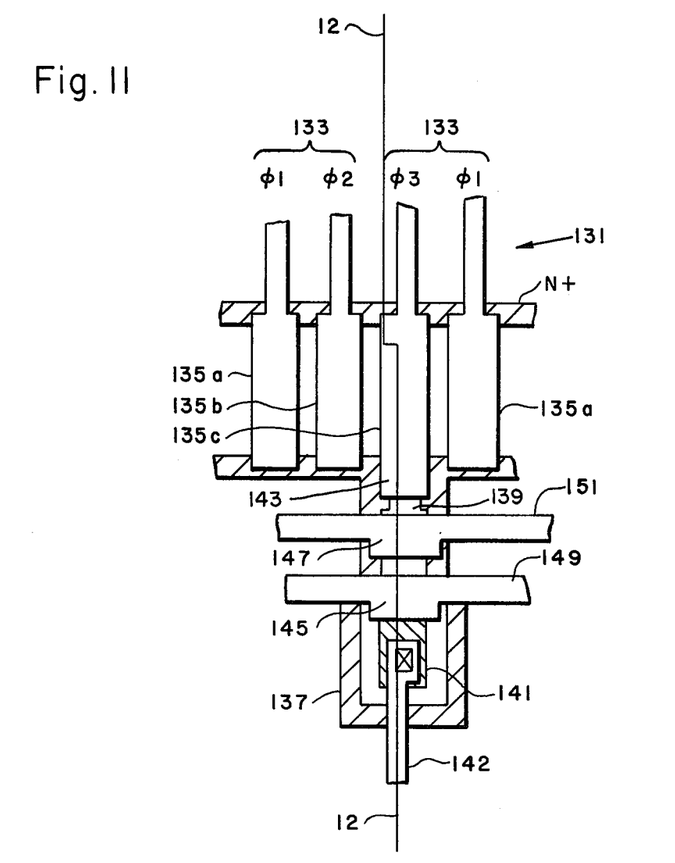
FIG. 11 is a partial plan-view of a modification of the invention whereby the direct injection technique of the present invention may be applied to a three-phase CCD.
Figure 12:
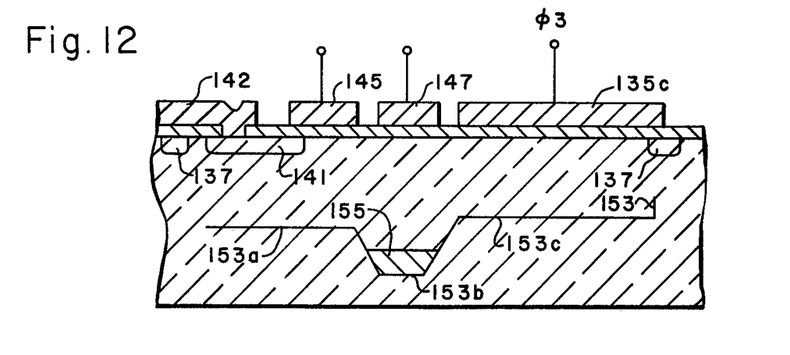
FIG. 12 is a cross-section through FIG. 12 illustrating its electrode structure.

It may be seen that the basic construction and method of operation of the CCD illustrated in FIGS. 10-12 are the same as those of the CCD of FIGS. 1-6, except for the manner in which charge is injected. Thus, the output circuit for reading charge from the CCD of FIGS. 8-10 may be exactly the same as that illustrated for FIGS. 1-6.

Application of the invention to a three-phase CCD shift register is illustrated in FIGS. 11 and 12. Except for the charge injecting structure, the CCD illustrated in FIGS. 11 and 12 is of conventional construction. Its elements include a series of electrodes 135 divided into three groups 135a, 135b, and 135c, respectively energized by phase 1, phase 2, and phase 3 clock voltages. The manner in which charge is shifted along a CCD by a three-phase-clock-energized set of electrodes is well known and need not be described here. It is explained in "The New Concept for Memory and Imaging: Charge Coupling," *Electronics*, June 21, 1971, pp. 50-59. An N+ diffusion provides a channel stop 137 which surrounds the path along which charge packets are to flow. An inlet 139 is provided in the region defined by the channel stop 137 into the substrate under the phase 3 electrode 135c of each CCD stage 133. The inlet 139 serves to provide a path for the charge injected from an injecting junction 141 located adjacent the phase 3 electrode 135c to which signals are fed through a contact 142. An extension 143 on each phase 3 electrode 135c reaches into the charge inlet 139 toward the injecting junction 141.

Disposed next to and partly overlapping the injecting junction 141 is an input transfer electrode 145, and an input storage electrode 147 is disposed between the transfer electrode and the phase 3 electrode 135c.

The desired potentials are applied to the input transfer and input storage electrodes 145 and 147 through bus lines 149 and 151, respectively, which also serve to apply their potentials to the input electrode structure of subsequent CCD stages 133 in the manner illustrated in greater detail in FIG. 10.

The electrodes 145 and 147 comprise the input electrode structure of the present invention which corresponds to the input electrode structure 41 of FIGS. 1-6. Several differences between the two will be noted, however, particularly with reference to FIG. 12. Thus, in the illustrated three-phase CCD, the input transfer and the input storage electrodes 145 and 147 are on the same level and are electrically separate. This type of construction lends itself to use with the three-phase CCD shown in FIGS. 11 and 12 in which all of the transfer-storage electrodes 135 are on the same level, so that all of the electrodes, including the input electrode structure 146, can be formed from the same metallization layer.

The manner in which charge is temporarily stored under the input storage electrode 147 is best seen from the depletion boundary 153 shown in FIG. 12. The boundary, which is shown to extend from under the injecting junction 141 to under the phase 3 electrode 135c has three regions, 153a, 153b, and 153c, whose general configuration is seen to be similar to the corresponding profile 49a, 49b, and 39a shown in FIG. 5. Thus, the depletion region 135a under the injecting junction 141 is extended by the potential on the transfer electrode 145 to near the edge of the storage electrode 147 under which the depletion region 135b is considerably deeper. When the phase 3 clock voltage is applied to the electrode 135c, the depletion region under that electrode 153c is shallower than the depletion region 153b under the storage electrode 147, causing a potential well to be created under the storage electrode in which a quantity of charge 155 coming from the injecting junction 141 may be stored. Such storage continues until the phase 3 potential is ON, at which time the depletion region 153c drops to a level below that under the storage electrode 147, permitting charge which had been stored in the potential well 153b to be shifted under the phase 3 electrode 135c.

The potentials on both of the input electrodes 145 and 147 are constant, but the potential on the latter 147 is adjusted to be higher than that on the electrode 145 so as to create the deeper depletion region thereunder which is necessary for injection.

What is claimed is:

1. In semiconductor apparatus wherein a dielectric layer is disposed over a surface of a semiconductive storage medium and a series of electrodes are disposed in or over said dielectric layer for causing a series of potential wells to be formed in response to voltages applied to said electrodes periodically, said potential wells being adapted to store packets of electric charge, said electrodes being operable in response to said voltages to transfer said charge packets along said potential wells, the improvement whereby charge may be injected directly into said storage medium comprising:

(a) means for injecting charge into said storage medium near at least one of said potential wells;

(b) means connected to said injecting means for generating an analog signal so as to cause a charge proportional to said analog signal to be injected into said substrate through said injecting means;

(c) an electrode structure disposed between said injecting means and said at least one potential well; and (d) a steady bias voltage source connected to said electrode structure, said electrode structure including a transfer portion nearest said injecting means and a storage portion nearest said at least one potential well and non-overlapping with said injecting means, said electrode structure and said steady bias voltage being arranged so as to maintain a potential well under said electrode structure which is deeper under said storage portion than it is under said transfer portion whereby said charge injected through said injecting means is temporarily stored under said storage portion, isolated from said injecting means.

2. The improvement of claim 1 characterized further in that said transfer portion and said storage portion are at the same electric potential, with the storage portion being positioned closer to the surface of said storage medium than said transfer portion in order to create a deeper potential well thereunder.

3. The improvement of claim 1 characterized further in that said storage portion is electrically separate from said transfer portion and in that said means for applying a steady bias voltage includes means for applying separate independently controlled steady bias voltages to said portions.

4. The improvement of claim 3 characterized further in that said transfer portion is positioned on the surface of said dielectric layer and said storage portion is buried in said dielectric layer.

5. In a CCD shift register for processing signals applied thereto directly from a plurality of I.R. detectors, said shift register having a dielectric layer disposed over a surface of a semiconductive storage medium and a series of electrodes disposed in or over said dielectric layer for causing a series of potential wells to be formed in response to voltages applied to said electrodes periodically, said potential wells being adapted to store packets of electric charge, said electrodes being operable in response to said voltages to transfer said charge packets along said potential wells, the improvement whereby charge may be injected directly into said storage medium from said I.R. detectors comprising:

(a) means for individually injecting charge from respective ones of said I.R. detectors into said storage medium near respective ones of said potential wells so that each said potential well becomes associated with a respective one of said injecting means;

(b) an electrode structure disposed between each said injecting means and its associated potential well; and (c) means for applying a steady bias voltage to said electrode structure such that a potential well is maintained under said electrode structure, said electrode structure including a transfer portion nearest said injecting means and a storage portion nearest said at least one potential well and non-overlapping with said injecting means, said electrode structure and said steady bias voltage being arranged so as to maintain a potential well under said electrode structure which is deeper under said storage portion than it is under said transfer portion whereby charge injected through said injecting means is temporarily stored under said storage portion, isolated from said injecting means.

6. The improvement of claim 5 characterized further in that said electrode structure includes a transfer portion nearest said injecting means and a storage portion nearest said associated potential well, and in that the potential well under said electrode structure is deeper under said storage portion than it is under said transfer portion.

7. The improvement of claim 6 characterized further in that the transfer portions of the respective electrode structures are formed from a first integral conductor strip and in that the storage portions of said electrode structures are formed from a second integral conductor strip.

8. The improvement of claim 7 characterized further in that said first conductor strip is disposed on the surface of said dielectric layer and in that said second conducting strip is buried in the body of said dielectric layer, said first and second conductor strips being maintained at the same steady bias voltage.

* * * * *